(12) United States Patent
Ma et al.

(10) Patent No.: US 8,921,864 B2
(45) Date of Patent: Dec. 30, 2014

(54) TFT-LCD ARRAY SUBSTRATE AND MANUFACTURING METHOD THEREOF

(75) Inventors: Xiaolong Ma, Shenzhen (CN); Hungjui Chen, Shenzhen (CN); Tsunglung Chang, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 294 days.

(21) Appl. No.: 13/380,047

(22) PCT Filed: Nov. 9, 2011

(86) PCT No.: PCT/CN2011/081999
§ 371 (c)(1),
(2), (4) Date: Dec. 22, 2011

(87) PCT Pub. No.: WO2013/053164
PCT Pub. Date: Apr. 18, 2013

(65) Prior Publication Data
US 2013/0092946 A1 Apr. 18, 2013

(30) Foreign Application Priority Data

Oct. 14, 2011 (CN) .......................... 2011 1 0311715

(51) Int. Cl.
| | |
|---|---|
| *H01L 27/14* | (2006.01) |
| *G02F 1/1343* | (2006.01) |
| *G02F 1/1362* | (2006.01) |
| *H01L 27/02* | (2006.01) |
| *H01L 27/12* | (2006.01) |

(52) U.S. Cl.
CPC .... *G02F 1/136259* (2013.01); *G02F 2201/506* (2013.01); *G02F 1/136286* (2013.01); *G02F 2201/40* (2013.01); *H01L 27/02* (2013.01); *G02F 2001/136263* (2013.01); *H01L 27/124* (2013.01); *G02F 2001/136272* (2013.01); *G02F 2201/18* (2013.01); *G02F 1/136204* (2013.01)
USPC .............. 257/72; 257/E27.111; 257/E29.275; 349/42; 349/43; 349/72; 349/151

(58) Field of Classification Search
USPC ......... 257/72, E27.111, E29.275; 349/38, 42, 349/43, 151
See application file for complete search history.

(56) References Cited

U.S. PATENT DOCUMENTS

| | | | |
|---|---|---|---|
| 6,738,109 B2 * | 5/2004 | Jeon ................................. | 349/43 |
| 7,843,519 B2 * | 11/2010 | He et al. .......................... | 349/38 |
| 2004/0246393 A1 * | 12/2004 | Elliott et al. .................... | 349/42 |
| 2009/0195718 A1 * | 8/2009 | He et al. .......................... | 349/38 |
| 2010/0103085 A1 * | 4/2010 | Lee et al. ......................... | 345/92 |
| 2012/0300165 A1 * | 11/2012 | Zhuang et al. ................. | 349/139 |

* cited by examiner

*Primary Examiner* — Zandra Smith
*Assistant Examiner* — Tsz Chiu

(57) ABSTRACT

The present invention provides a TFT-LCD array substrate having a gate-line metal layer, a data-line metal layer crossing the gate-line metal layer and a plurality of layers covering a periphery of the gate-line metal layer and the data-line metal layer; the gate-line metal layer has first gate lines and second gate lines parallel and alternately arranged, the date-line metal layer has first data lines and second data lines parallel and alternately arranged; the first gate line and the second gate line are electrically connected; the first data line and the second data line are electrically connected. The present invention further provides a manufacturing method of the TFT-LCD array substrate. Implementing the TFT-LCD array substrate and the manufacturing method can reduce the occurrence of line-broken in the active array of TFT-LCD, increase the aperture ratio of the product and enhance yield rate of the products.

10 Claims, 4 Drawing Sheets

TFT-LCD ARRAY SUBSTRATE AND MANUFACTURING METHOD THEREOF

FIELD OF THE INVENTION

The present invention relates to a field of liquid crystal display, and more particularly to a TFT-LCD array substrate and a manufacturing method thereof.

BACKGROUND OF THE INVENTION

Since a TFT (Thin Film Transistor) LCD has advantages of being small size, low power consumption and radiation-free, it has been intensively developed in recent years.

A liquid crystal panel is an important component of a liquid crystal display device and has a CF substrate, an array substrate and a liquid crystal layer disposed therebetween. During the manufacturing process of a TFT-LCD array substrate, although great efforts have been made to control the process, the defects of disconnection of gate lines or data lines still inevitably occur. The defects are not only hard to be repaired, but also cause a huge waste of manufacturing cost.

With reference to FIG. 1, a structural schematic view showing a conventional wire repair structure for gate lines and data lines in a conventional TFT-LCD array substrate, in FIG. 1, a data line and a common electrode line are respectively divided into two sections, and are connected together in positions Y and Z, respectively. When the gate line is broken in position X, it can be repaired by following method: firstly use a laser to cut the data line at positions D1, D3, D5, D7 in the figure, and then use the laser to cut the common electrode at positions D2, D4, D6; and then use a high-power laser to weld and connect the gate line, the common electrode in a first metal layer and the data line in a second metal layer at position C1, C2, C3 and C4. After finishing the foregoing operations, a signal flow will be transmitted along an arrow direction shown in FIG. 1: the gate line- to the data line via C1- to the common electrode via C2- to the data line via C3- to the gate line via C4, therefore the gate line broke at position X can be repaired through the foregoing implementation. Such repairing method has following disadvantages:

1. Complicated repairing process, usually repairing a broken line takes 4 to 10 times of laser irradiation, which causes low repairing efficiency;
2. The dual-line structure design for common electrode affects aperture ratio more greatly that may increase power consumption;
3. Since it is to form a bypass circuit wire to accomplish the repairing object, wire length will be increased inevitably and increases the voltage drop on the wire.

SUMMARY OF THE INVENTION

In order to solve the conventional technical problem that the broken wire on the substrate requires complicated repair and high repairing cost, it is necessary to provide a TFT-LCD array substrate, and the TFT-LCD array substrate comprises a gate-line metal layer, and a data-line metal layer overlapping the gate-line metal layer and a plurality of layers mounted at and covering peripheries of the gate-line metal layer and the data-line metal layer, and the plurality of layers include a gate-insulated layer, a semiconductor layer, an ohmic contact layer, a passive layer and a transparent conductive layer, and the array substrate orderly includes the gate-line metal layer, the gate-insulated layer, the semiconductor layer, the ohmic contact layer, the data-line metal layer, the passive layer and the transparent conductive layer; the gate-line metal layer has first gate lines and second gate lines that are parallel with each other and alternately arranged; the date-line metal layer has first data lines and second data lines that are parallel with each other and alternately arranged; overlapping areas between the first gate line and the second gate line of the gate-line metal layer and the first data line and the second data line forms a plurality of parasitic capacitors; the first gate line and the second gate line are connected to each other through conductive wires; the first data line and the second data line are connected to each other through conductive wires.

Furthermore, the first gate line and the second gate line are connected through a plurality of conductive wires and the conductive wires are mounted parallelly with each other; the first data line and the second data line are connected through a plurality of conductive wires and the conductive wires are mounted parallelly with each other.

The present invention further discloses a TFT-LCD array substrate, the TFT-LCD array substrate comprises a gate-line metal layer, and a data-line metal layer overlapping the gate-line metal layer and a plurality of layers mounted at and covering peripheries of the gate-line metal layer and the data-line metal layer, wherein the gate-line metal layer has first gate lines and second gate lines that are parallel with each other and alternately arranged; the date-line metal layer has first data lines and second data lines that are parallel with each other and alternately arranged; the first gate line and the second gate line are electrically connected to each other; and the first data line and the second data line are connected to each other.

Furthermore, the plurality of layers include a gate-insulated layer, a semiconductor layer, an ohmic contact layer, a passive layer and a transparent conductive layer, and the array substrate orderly includes the gate-line metal layer, the gate-insulated layer, the semiconductor layer, the ohmic contact layer, the data-line metal layer, the passive layer and the transparent conductive layer;

Furthermore, the first gate line and the second gate line are connected to each other through conductive wires; the first data line and the second data line are connected to each other through conductive wires.

Furthermore, the gate-line metal layer includes a plurality of the first gate lines and a plurality of the second gate lines, and the data-line metal layer includes a plurality of the first data lines and a plurality of the second data lines; the plurality of the first gate lines and the plurality of the second gate lines and the plurality of the first data lines and the plurality of the second data lines cross each other to define a plurality of pixel electrode areas; and each pixel electrode area has a thin-film transistor mounted therein, and the gate of the thin-film transistor is connected to the first gate line or the second gate line, the source of the thin-film transistor is connected to the first data line or the second data line, and the drain of the thin-film transistor is connected to the pixel electrode.

Furthermore, the transparent conductive layer is partially overlapped with the first gate line and/or the second gate line of the gate-line metal layer to form a storage capacitor.

Furthermore, the first gate line and the second gate line are connected through a plurality of conductive wires and the conductive wires are mounted parallelly with each other; the first data line and the second data line are connected through a plurality of conductive wires and the conductive wires are mounted parallelly with each other.

Furthermore, an overlapping area between the first gate line and the second gate line of the gate-line metal layer and the first data line and the second data line of the data-line metal layer forms a plurality of parasitic capacitors.

Furthermore, the first gate line and the second gate line transmit the same scan signals.

Furthermore, the first data line and the second data line transmit the same data voltage signals.

The present invention further discloses a manufacturing method of a TFT-LCD array substrate comprising following steps: step 1: making a first gate line and a second gate line to be parallel with each other and alternately arranged on a gate-line metal layer; step 2: electrically connecting the first gate line and the second gate line; step 3: making a first data line and second data line to be parallel with each other and alternately arranged on a data-line metal layer; step 4: electrically connecting the first data line and the second data line; step 5: crossing the gate-line metal layer with the data-line metal layer and covering a periphery of the gate-line metal layer and the data-line metal layer with a plurality of layers to form the TFT-LCD substrate.

In the implementation of the TFT-LCD array substrate and the manufacturing method thereof of the present invention, since the gate-line metal layer has the two adjacent parallel-arranged first gate line and second gate line, the data-line metal layer has the two adjacent parallel-arranged first data line and second data line, the first gate line is electrically connected to the second gate line, and the first data line is electrically connected to the second data line, it accomplishes a dual conducting structure of the gate lines of the gate-line metal layer and data-line metal layer, when the gate line or the data line is broken, a signal can be transmitted through a bypass constructed by the adjacent line, and thereby achieves the object of conduction.

DESCRIPTION OF THE DRAWINGS

The structure and the technical means adopted by the present invention to achieve the above and other objects can be best understood by referring to the following detailed description of the preferred embodiments and the accompanying drawings. Obviously, the following drawings are merely shown for some embodiments of the present invention. For a person skilled in the art, other drawings can be obtained according these drawings without creative labor.

DETAILED DESCRIPTION OF THE PREFERRED EMBODIMENTS

The technical solutions of the present invention can be best understood by referring to the following detailed description of the preferred embodiments and the accompanying drawings. Obviously, the following detailed description of the embodiment is only a portion of the embodiments of the present invention, but not the all embodiments. Based on the embodiments of the present invention, other changes and modifications to the described embodiments by a person skilled in the art without creative labor belong to the scope of the invention.

Figure 1:
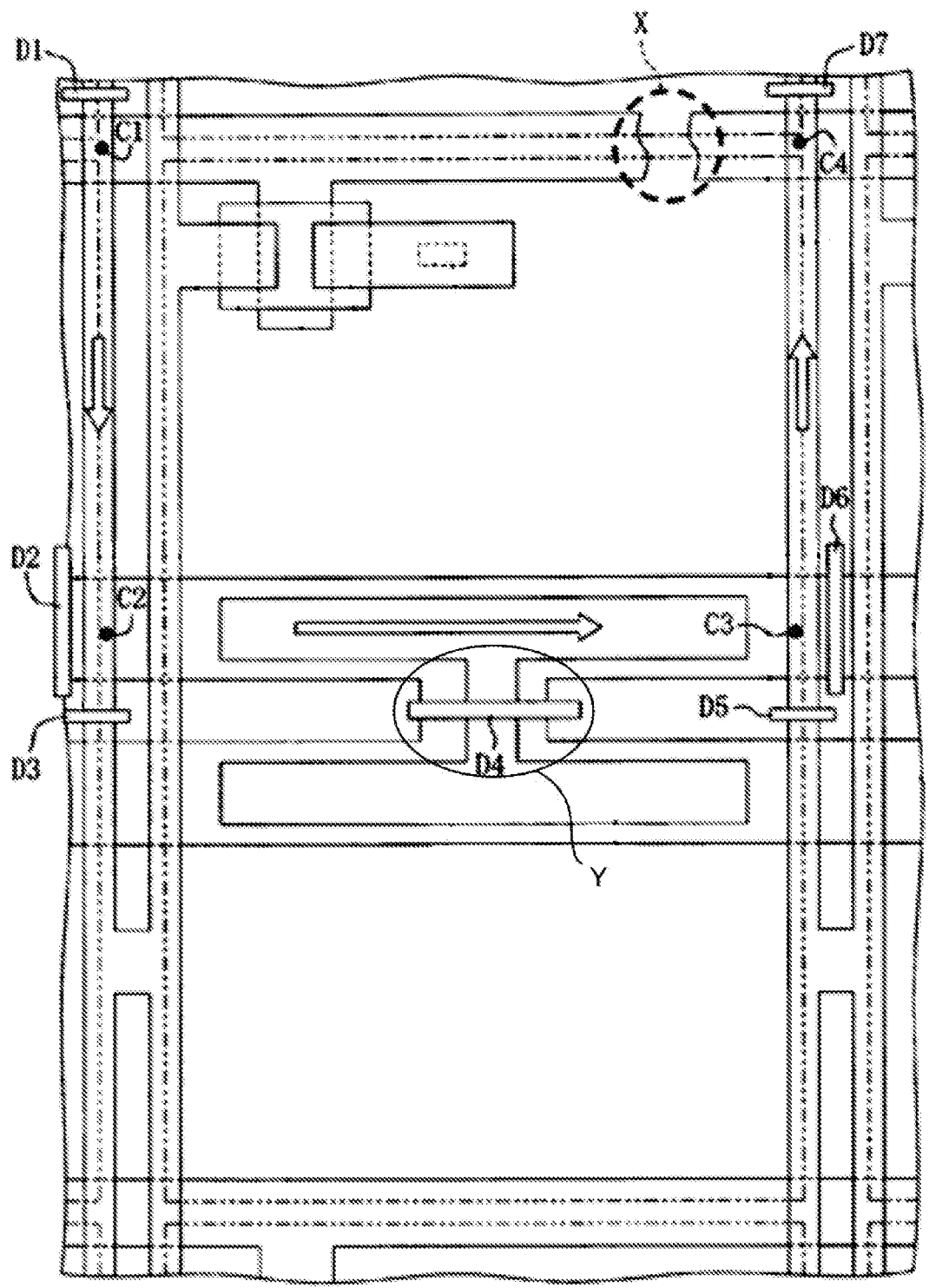
FIG. 1 is a structural schematic view showing a conventional wire repair structure for gate line and data line in a conventional TFT-LCD array substrate.
Figure 2:
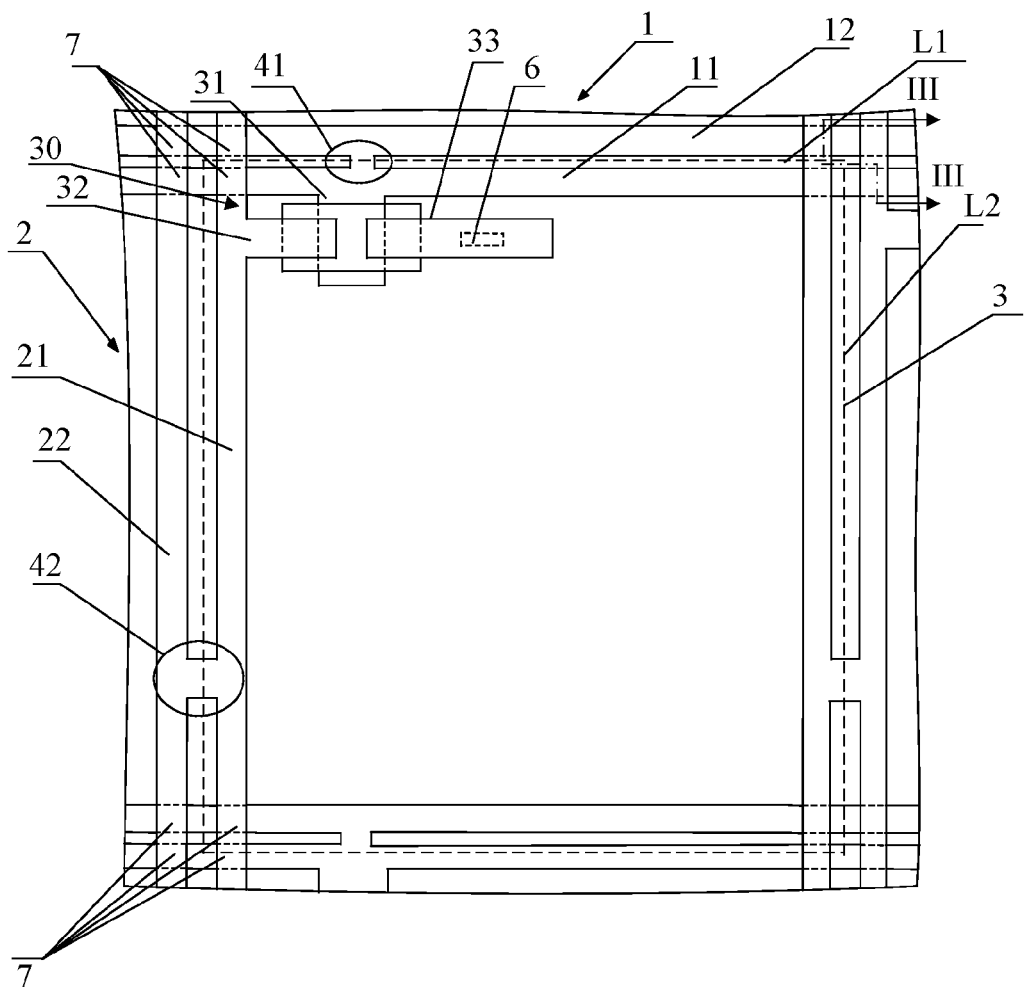
FIG. 2 is a structural schematic view of a TFT-LCD array substrate according to a preferred embodiment of the present invention.

With reference to FIG. 2, FIG. 2 is a structural schematic view of a TFT-LCD array substrate according to a preferred embodiment of the present invention. The TFT-LCD array substrate comprises a gate-line metal layer 1, a data-line metal layer 2 and a plurality of layers mounted at and covering peripheries of the gate-line metal layer 1 and the data-line metal layer 2. The plurality of the layers mainly include a gate-insulated layer, a semiconductor layer, an ohmic contact layer, a passive layer and a transparent conductive layer that covers the peripheries of the gate-line metal layer 1 and the data-line metal layer 2. The array substrate orderly comprises the gate-line metal layer 1, the gate-insulated layer, the semiconductor layer, the ohmic contact layer, the data-line metal layer 2, the passive layer and the transparent layer.

The gate-line metal layer 1 has first gate lines 11 and second gate lines 12 that are parallel with each other and alternately arranged, and the first gate lines 11 and the second gate lines 22 are electrically connected. The data-line metal layer 2 has first data lines 21 and second data lines 22 that are parallel with each other and alternately arranged, and the first data lines 21 and the second data lines 22 are electrically connected. The first gate lines 11 and the second gate lines 12 transmit the same scan signals.

Wherein, in the first gate line 11 and second gate line 12 that are parallel-arranged in the gate-line metal layer 1 shown in FIG. 2, the first gate line 11 and the second gate line 12 are electrically connected with each other through conductive wires 41, and in the first data line 21 and second data line 22 that are parallel-arranged in the data-line metal layer 2, the first data line 21 and the second data line 22 are electrically connected with each other through conductive wires 42.

Certainly, the mounting positions of the conductive wires 41, 42 that connect the first gate line 11 and the second gate line 12 and connect the first data line 21 and the second data line 22 can be adjusted according to a size of an area where the corresponding gate-line metal layer 1 and the data-line metal layer 2 crossing each other to form a pixel electrode area 3, specifically:

The pixel electrode area 3 is rectangle shaped in a planar view, and define the side of the pixel electrode area 3 that is parallel with the first gate line 11 and the second gate line 12 as a width side L1, and define the side of the pixel electrode area 3 that is parallel with the first data line 21 and the second data line 22 as a length side L2. The conductive wires 41 that connect the first gate line 11 and the second gate line 12 are perpendicular to the width side L1 of the pixel electrode area 3. The conductive wires 42 that connect the first data line 21 and the second data line 22 are perpendicular to the length side L2 of the pixel electrode area 3. Furthermore, the conductive wires 41 may be mounted at any position between the first gate line 11 and the second gate line 12, so as to accomplish a dual conducting structure of the gate line of the gate-line metal layer 1 and allows the gate-line metal layer 1 to make conduction through the first gate line 11 and/or the second gate line 12. When the first gate line 11 or the second gate line 12 of the gate-line metal layer 1 is broken, a signal can still be transmitted through the conductive wires 41 to the adjacent gate line to continue transmission and thereby achieve an object of conduction.

Similarly, the conductive wire 42 can be mounted at any position between the first data line 21 and the second data line 22, so as to accomplish a dual conducting structure of the data line of the data-line metal layer 2 and allows the data-line metal layer 2 to make conduction through the first data line 21 and/or the second data line 22. When the first data line 21 or the second data line 22 of the data-line metal layer 2 is broken, a signal can still be transmitted through the conductive wires 42 to the adjacent data line to continue transmission and thereby achieve an object of conduction.

The pixel electrode area 3 has a thin-film transistor 30 mounted therein, and a gate 31 of the thin-film transistor 30 is connected to the first gate line 11, a source 32 of the thin-film transistor 30 is connected to the first data line 21, and the pixel electrode area 3 has a contact 6 mounted therein to electrically connect a drain 33 of the thin-film transistor 30 and a pixel electrode. Certainly, in other embodiments, the gate 31 of the thin-film transistor 30 can also be directly connected to the second gate line 12; the source 32 of the thin-film transistor 30 can also be directly connected to the second data line 22.

The pixel electrode area 3 of the TFT-LCD array substrate of the embodiment of the present invention (which is located at the transparent conductive layer, not shown in the figure) is partially overlapped with the first gate line 11 and/or the second gate line 12 to form a storage capacitor (not shown in figure), wherein the storage capacitor can make liquid crystal molecules to work stably. In this embodiment, since the data-line metal layer 2 comprises two parallelly connected data lines: the first data line 21 and the second data line 22, and the two data lines of the data-line metal layer 2 and the two gate lines of the gate-line metal layer 1 are conducted with each other, therefore, the first data line 21 and the second data line 22 transmit the same data voltage signals. The sum of the cross section area of the first data line 21 and the second data line 22 is twice the cross section area of a single data line in the conventional technology, which reduces electrical impedance and lowers the transmission voltage on the first data line 21 and the second data line 22.

Figure 3:
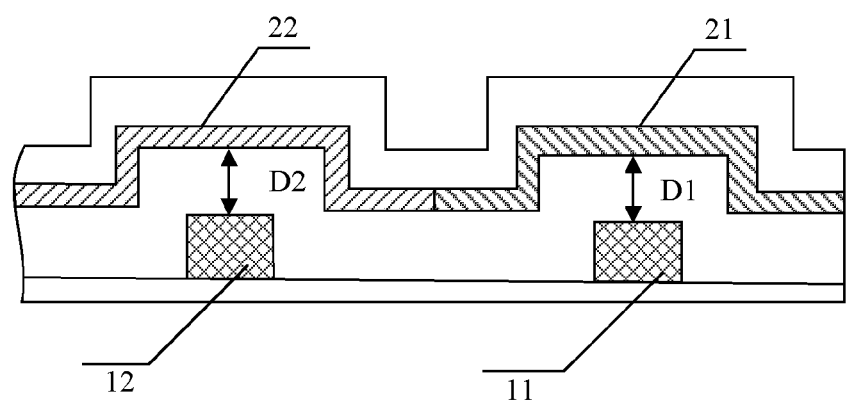
FIG. 3 is a partial cross-sectional view taken along the line III-III in the TFT-CLD array substrate in FIG. 2.
Figure 4:
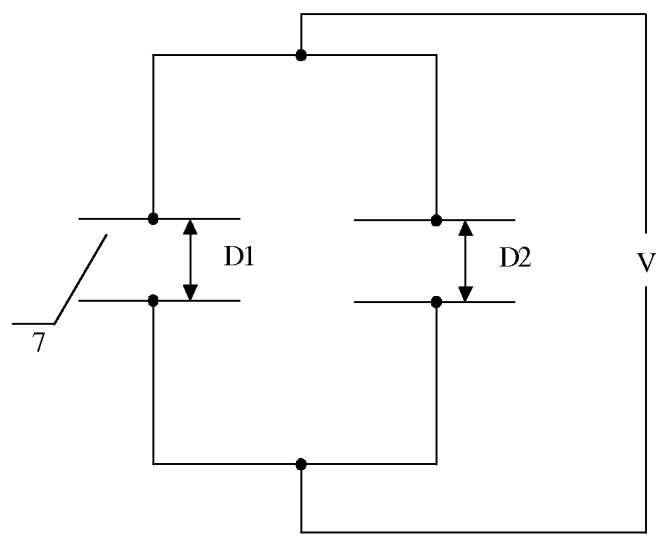
FIG. 4 is a circuit diagram of the parasitic capacitor in FIG. 3.

As shown in FIG. 2, the two first data lines 21 and the two second data lines 22 are respectively overlapped with the two first gate lines 11 and the two second gate lines 12 to form four sets, 16 in total, of parasitic capacitors 7. With reference to FIG. 3, FIG. 3 is a partial cross-sectional view taken along the line III-III in the TFT-CLD array substrate in FIG. 2. The gate-line metal layer 1 comprises two parallel-arranged and connected data lines: the first gate line 11 and the second gate line 12, and the data-line metal layer 2 comprises two parallel-arranged and connected data lines: the first data line 21 and the second data line 22. A distance between the first data line 21 and the first gate line 11 is D1, and forms the parasitic capacitors. A distance between the second data line 22 and the second gate line 12 is D2, and forms the parasitic capacitors. Because a relatively large amount of static charges formed in the above-mentioned overlapping area between the gate lines and the data lines, with the plurality of the parasitic capacitors, the static charges can be dispersed to the foregoing parasitic capacitors, and thereby lowers the danger of electrostatic breakdown. With reference to FIG. 4, a circuit diagram of the parasitic capacitor in FIG. 3, an overlapping area between two gate lines and two data lines forms two parasitic capacitors connected in parallel, wherein, the distance D1 between the first data line 21 and the first gate line 11 and the distance D2 between the second data line 22 and the second gate line 12 are equal. An externally formed electrostatic voltage V applied to the above-mentioned parasitic capacitors 7 connected in parallel is dispersed to the parasitic capacitors 7 connected in parallel. Since the size of the overlapping area between the two gate lines and the two data lines is increased, the number of the parasitic capacitors will be increased accordingly, therefore, the ability of storing charges is enhanced and the probability of the occurrence of electrostatic breakdown is lowered.

Figure 5:
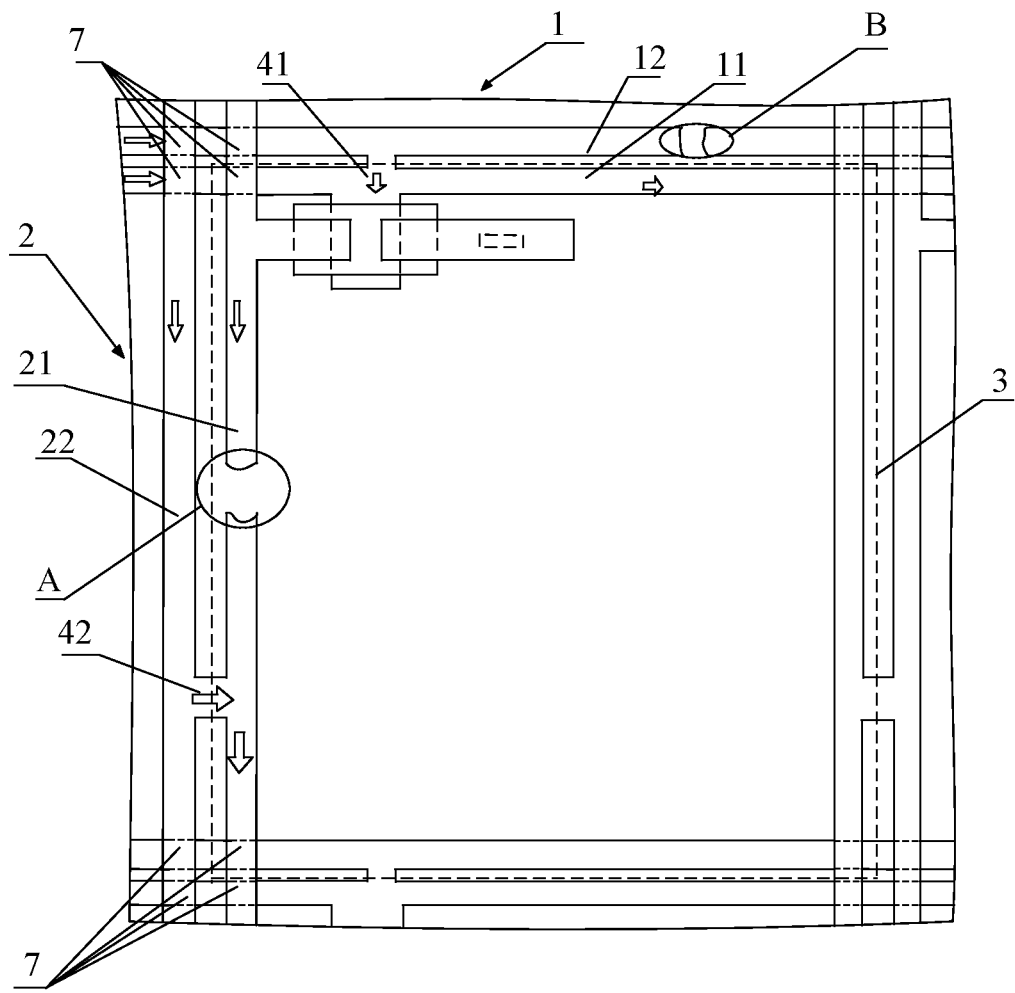
FIG. 5 is a plane view showing the signal transmission when the gate line and the data line are broken in the TFT-LCD array substrate in accordance with the present invention.

As the TFT-LCD array substrate of the embodiment is implemented specifically, it will be able to accomplish an auto-repairing of the gate lines or the data lines. The description of the auto repairing function is described as follows: with reference to FIG. 5, a structural schematic view of the TFT-LCD array substrate according to the embodiment of the present invention, when the data line 22 of the data-line metal layer 2 of the TFT-LCD array substrate has a line-broken defect occurred at A point, since the two data lines the first data line 21 and the second data line 22 are parallel-arranged and electrically-connected, the data signal can still be transmitted to the second data line 22 through the conductive wires 42 (as the arrow direction shown in the figure), to achieve signal transmission with the second data line 22. For another example, when the gate line 12 of the gate-line metal layer 1 of the TFT-LCD array substrate has a line-broken defect occurred at B point, since the two gate lines the first gate line 11 and the second gate line 12 are parallel-arranged and electrically-connected, the data signal can still be transmitted to the first gate line 11 through the conductive wires 41 to achieve signal transmission with the first gate line 11.

In the above-described implementing process, the pixel electrode area 3 is partially overlapped with the first gate line 11 and/or the second gate line 12 of the gate-line metal layer 1 to form a storage capacitor, and as the size of the overlapping area between the data-line metal layer 2 and the pixel electrode area 3 increases, the cross section area of the first data line 21 and the second data line 22 is increased, and the electrical impedance is reduced, and then further to lower the transmission voltage on the first data line 21 and the second data line 22. Also because the two first data lines 21 and the two second data lines 22 and the two first gate lines 11 and the two second gate lines 12 are overlapped and forms 4 sets, 16 in total, of parasitic capacitors 7, static charges can be dispersed to the foregoing parasitic capacitors 7. Therefore, the danger of electrostatic breakdown to the TFT-LCD array substrate can be reduced.

An embodiment of the present invention further discloses a manufacturing method of the TFT-LCD array substrate which comprises follow steps:

step 1: making a first gate line and a second gate line to be parallel with each other and alternately arranged in a gate-line metal layer;

step 2: electrically connecting the first gate line and the second gate line;

step 3: making a first data line and second data line to be parallel with each other and alternately arranged in a data-line metal layer;

step 4: electrically connecting the first data line and the second data line;

step 5: crossing the gate-line metal layer with the data-line metal layer and covering peripheries of the gate-line metal layer and the data-line metal layer with a plurality of layers to form the TFT-LCD substrate.

Preferably, in the foregoing step 2, the first gate line and the second gate line are electrically connected to each other through conductive wires, and in step 4, the first data line and the second data line are electrically connected to each other through conductive wires;

Preferably, in step 5, the plurality of layers include a gate-insulated layer, a semiconductor layer, an ohmic contact layer, a passive layer and a transparent conductive layer. The plurality of layers, the gate-line metal layer and the data-line metal layer form the TFT-LCD array substrate jointly.

Specifically, the gate-line metal layer includes a plurality of the first gate lines and a plurality of the second gate lines, and the data-line metal layer includes a plurality of the first data lines and a plurality of the second data lines; the plurality of the first gate lines and the plurality of the second gate lines and the plurality of the first data lines and the plurality of the second data lines define a plurality of pixel electrode areas; and each pixel electrode area has a thin-film transistor mounted therein, and the gate of the thin-film transistor is directly connected to the first gate line or the second gate line, the source of the thin-film transistor is directly connected to the first data line or the second data line, and the drain of the thin-film transistor is connected to a pixel electrode.

Specifically, partially overlap the transparent conductive layer with the first gate line and/or the second gate line of the gate-line metal layer to form a storage capacitor; overlap the gate-line metal layer and the data-line metal layer to form a plurality of parasitic capacitors.

The manufacturing method of the TFT-LCD array substrate of the embodiment in accordance with the present invention can reduce the occurrence of line-broken in the active array of TFT-LCD, increase the aperture ratio of the product and enhance yield rate of the products.

In the implementation of the TFT-LCD array substrate and the manufacturing method of the present invention, since the gate-line metal layer has the adjacent parallel-arranged first gate line and second gate line, the data-line metal layer has the adjacent parallel-arranged first data line and second data line, the first gate line is electrically connected to the second gate line, and the first data line is electrically connected to the second data line, it accomplishes a dual conducting structure of the gate lines of the gate-line metal layer and data-line metal layer, when the gate line or the data line is broken, a signal can be transmitted through a bypass constructed by the adjacent line, and thereby achieves the object of conduction; and the cross section area of the first data line and the second data line is increased, the electrical impendence is reduced, and the transmission voltage on the first data line and the second data line is reduced, at the same time, static charges can be dispersed to the plurality of the capacitors to reduce the danger of electrostatic breakdown. The manufacturing method of the TFT-LCD array substrate of the embodiment of the present invention can reduce the occurrence of line-broken in the active array of TFT-LCD, increase the aperture ratio of the product and enhance yield rate of the products.

The present invention has been described with preferred embodiments thereof and it is understood that many changes and modifications to the described embodiments can be carried out without departing from the scope and the spirit of the invention that is intended to be limited only by the appended claims.

The invention claimed is:

1. A TFT-LCD array substrate, characterized in that: the TFT-LCD array substrate comprises: a gate-line metal layer, and a data-line metal layer overlapping the gate-line metal layer and a plurality of layers mounted at and covering peripheries of the gate-line metal layer and the data-line metal layer, wherein the plurality of layers include a gate-insulated layer, a semiconductor layer, an ohmic contact layer, a passive layer and a transparent conductive layer, and the array substrate orderly includes the gate-line metal layer, the gate-insulated layer, the semiconductor layer, the ohmic contact layer, the data-line metal layer, the passive layer and the transparent conductive layer; the gate-line metal layer has first gate lines and second gate lines that are parallel with each other and alternately arranged; the date-line metal layer has first data lines and second data lines that are parallel with each other and alternately arranged; overlapping areas between the first gate line and the second gate line of the gate-line metal layer and the first data line and the second data line forms a plurality of parasitic capacitors, wherein the first data line and the second data line are overlapped with the first gate line and the second gate line to form four parasitic capacitors; the first gate line and the second gate line are connected to each other through conductive wires; the first data line and the second data line are connected to each other through conductive wires.

2. The TFT-LCD array substrate as claimed in claim 1, characterized in that: the first gate line and the second gate line are connected through a plurality of conductive wires and the conductive wires are mounted parallelly with each other; the first data line and the second data line are connected through a plurality of conductive wires and the conductive wires are mounted parallelly with each other.

3. A TFT-LCD array substrate, characterized in that: the TFT-LCD array substrate comprises a gate-line metal layer, and a data-line metal layer overlapping the gate-line metal layer and a plurality of layers mounted at and covering peripheries of the gate-line metal layer and the data-line metal layer, wherein the gate-line metal layer has first gate lines and second gate lines that are parallel with each other and alternately arranged; the date-line metal layer has first data lines and second data lines that are parallel with each other and alternately arranged, wherein the first data line and the second data line are overlapped with the first gate line and the second gate line to form four parasitic capacitors;
   the first gate line and the second gate line are electrically connected to each other; and
   the first data line and the second data line are connected to each other.

4. The TFT-LCD array substrate as claimed in claim 3, characterized in that: the plurality of layers include a gate-insulated layer, a semiconductor layer, an ohmic contact layer, a passive layer and a transparent conductive layer, and the array substrate orderly includes the gate-line metal layer, the gate-insulated layer, the semiconductor layer, the ohmic contact layer, the data-line metal layer, the passive layer and the transparent conductive layer; and
   the first gate line and the second gate line are connected to each other through conductive wires; the first data line and the second data line are connected to each other through conductive wires.

5. The TFT-LCD array substrate as claimed in claim 4, characterized in that: the adjacent and electrically connected first gate line and second gate line, and the adjacent and electrically connected first data line and second data line cross each other to define a plurality of pixel electrode areas, and each pixel electrode area has a thin-film transistor mounted therein, and a gate of the thin-film transistor is connected to the first gate line or the second gate line, a source of the thin-film transistor is connected to the first data line or the second data line, and a drain of the thin-film transistor is connected to a pixel electrode.

6. The TFT-LCD array substrate as claimed in claim 4, characterized in that: the transparent conductive layer is partially overlapped with the first gate line and/or the second gate line of the gate-line metal layer to form a storage capacitor.

7. The TFT-LCD array substrate as claimed in claim 4, characterized in that: the first gate line and the second gate line are connected through a plurality of conductive wires and the conductive wires are mounted parallelly with each other; the first data line and the second data line are connected through a plurality of conductive wires and the conductive wires are mounted parallelly with each other.

8. The TFT-LCD array substrate as claimed in claim 3, characterized in that: overlapping areas between the first gate line and the second gate line of the gate-line metal layer and the first data line and the second data line of the data-line metal layer forms a plurality of parasitic capacitors.

9. The TFT-LCD array substrate as claimed in claim 3, characterized in that: the first gate line and the second gate line transmit the same scan signals.

10. The TFT-LCD array substrate as claimed in claim 3, characterized in that: the first data line and the second data line transmit the same data voltage signals.

* * * * *